(12) United States Patent
Dai

(10) Patent No.: US 9,786,692 B2
(45) Date of Patent: Oct. 10, 2017

(54) SCAN DRIVING CIRCUIT AND NAND LOGIC OPERATION CIRCUIT THEREOF

(71) Applicant: Shenzhen China Star Optoelectronics Technology Co., Ltd., Shenzhen, Guangdong (CN)

(72) Inventor: Chao Dai, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 367 days.

(21) Appl. No.: 14/433,857

(22) PCT Filed: Jan. 28, 2015

(86) PCT No.: PCT/CN2015/071705
§ 371 (c)(1),
(2) Date: Apr. 6, 2015

(87) PCT Pub. No.: WO2016/109994
PCT Pub. Date: Jul. 14, 2016

(65) Prior Publication Data
US 2017/0229081 A1    Aug. 10, 2017

(30) Foreign Application Priority Data

Jan. 9, 2015 (CN) .......................... 2015 1 0013180

(51) Int. Cl.
*H01L 27/12* (2006.01)
*G02F 1/1368* (2006.01)
*H03K 19/0944* (2006.01)
*G09G 3/36* (2006.01)

(52) U.S. Cl.
CPC .......... *H01L 27/124* (2013.01); *G02F 1/1368* (2013.01); *H01L 27/1225* (2013.01); *H03K 19/0944* (2013.01); *G09G 3/3677* (2013.01); *G09G 2300/0408* (2013.01); *G09G 2310/0291* (2013.01)

(58) Field of Classification Search
CPC ......... G09G 3/3677; G09G 2310/0291; G09G 2300/0408; G02F 1/1368; H03K 19/0944; H01L 27/124; H01L 27/1225
See application file for complete search history.

(56) References Cited

U.S. PATENT DOCUMENTS 7,952,392 B2 * 5/2011 Koyama ............. H01L 27/1225
257/268
8,013,633 B2 * 9/2011 Luo .................. H03K 19/09441
326/63

* cited by examiner

*Primary Examiner* — Liliana Cerullo
(74) *Attorney, Agent, or Firm* — Andrew C. Cheng

(57) ABSTRACT

The invention provides a scan driving circuit for an oxide semiconductor thin film transistor and a NAND logic operation circuit thereof. The NAND logic operation circuit includes: a first inverter and a second inverter applied to a pull-down holding circuit of a GOA circuit, and multiple transistors. The invention uses the combination of NFTF and inverter to replace a function of original PMOS elements and thereby achieves characteristics similar to that of the original CMOS NAND operation circuit. Accordingly, the invention can solve the design problem of IGZO TFT single type of device logic operation circuit and thus is more suitable for integrating a large scale digital integrated circuit on a liquid crystal display device.

19 Claims, 3 Drawing Sheets

SCAN DRIVING CIRCUIT AND NAND LOGIC OPERATION CIRCUIT THEREOF

TECHNICAL FIELD

The invention relates to the field of liquid crystal display technology, and particularly to a scan driving circuit for an oxide semiconductor thin film transistor and a NAND logic operation circuit thereof.

DESCRIPTION OF RELATED ART

For a large scale integrated circuit, basic three devices of logic operation circuit are inverter, NAND and NOR and generally the three devices are formed by CMOS FETs, that is, the circuit has two types of devices of PMOS and NMOS.

In oxide semiconductor devices, IGZO has become the focus of attention of the next generation display device, and the oxide semiconductor has good NTFT characteristics due to a special material structure itself. However, the thin film transistors (TFTs) also include two types of devices, i.e., NTFT and PTFT, and generally only the LTPS process can obtain a PTFT device with good performance. Therefore, how to use a single type of device (PTFT or NTFT) to manufacture an inverter, a NAND or a NOR has become a problem urgently to be solved.

SUMMARY

A technical problem mainly to be solved by the invention is to provide a scan driving circuit for an oxide semiconductor thin film transistor and a NAND logic operation circuit thereof, which can use a single type of device (PTFT or NTFT) to manufacture a NAND.

In order to solve the above technical problem, a technical solution proposed by the invention is to provide a NAND logic operation circuit. The circuit includes: a first inverter and a second inverter applied to a pull-down holding circuit of a GOA circuit; and a ninth transistor, a gate of the ninth transistor being electrically connected to an output terminal of the first inverter, a drain of the ninth transistor being electrically connected to a constant high potential, and a source of the ninth transistor being electrically connected to an output terminal of the logic operation circuit; a tenth transistor, a gate of the tenth transistor being electrically connected to an output terminal of the second inverter, a drain of the tenth transistor being electrically connected to the constant high potential, and a source of the tenth transistor being electrically connected to the output terminal of the logic operation circuit; an eleventh transistor, a gate of the eleventh transistor being electrically connected to a first input terminal of the logic operation circuit, and a drain of the eleventh transistor being electrically connected to the output terminal of the logic operation circuit; a twelfth transistor, a gate of the twelfth transistor being electrically connected to a second input terminal of the logic operation circuit, a drain of the twelfth transistor being electrically connected to a source of the eleventh transistor, and a source of the twelfth transistor being electrically connected to a constant low potential. The first inverter and the second inverter are configured (i.e., structured and arranged) for receiving circuit control signals by the constant low potential and a first negative potential.

In order to solve the above technical problem, another technical solution proposed by the invention is to provide a NAND logic operation circuit. The circuit includes: a first inverter and a second inverter applied to a pull-down holding circuit of a GOA circuit; and a ninth transistor, a gate of the ninth transistor being electrically connected to an output terminal of the first inverter, a drain of the ninth transistor being electrically connected to a constant high potential, and a source of the ninth transistor being electrically connected to an output terminal of the logic operation circuit; a tenth transistor, a gate of the tenth transistor being electrically connected to an output terminal of the second inverter, a drain of the tenth transistor being electrically connected to the constant high potential, and a source of the tenth transistor being electrically connected to the output terminal of the logic operation circuit; an eleventh transistor, a gate of the eleventh transistor being electrically connected to a first input terminal of the logic operation circuit, and a drain of the eleventh transistor being electrically connected to the output terminal of the logic operation circuit; a twelfth transistor, a gate of the twelfth transistor being electrically connected to a second input terminal of the logic operation circuit, a drain of the twelfth transistor being electrically connected to a source of the eleventh transistor, and a source of the twelfth transistor being electrically connected to a constant low potential.

In an embodiment, the first inverter and the second inverter are the same and each include: a first transistor, a gate and a drain of the first transistor being electrically connected to the constant high potential, and a source of the first transistor being electrically connected to a first node; a second transistor, a gate of the second transistor being electrically connected to an input terminal of the inverter, a drain of the second transistor being electrically connected to the first node, and a source of the second transistor being electrically connected to a first negative potential; a third transistor, a gate of the third transistor being electrically connected to the first node, a drain of the third transistor being electrically connected to the constant high potential, and a source of the third transistor being electrically connected to an output terminal of the inverter; a fourth transistor, a gate of the fourth transistor being electrically connected to the input terminal of the inverter, a drain of the fourth transistor being electrically connected to the output terminal of the inverter, and a source of the fourth transistor being electrically connected to a second node; a fifth transistor, a gate and a drain of the fifth transistor being electrically connected to the constant high potential, and a source of the fifth transistor being electrically connected to a third node; a sixth transistor, a gate of the sixth transistor being electrically connected to the input terminal of the inverter, a drain of the sixth transistor being electrically connected to the third node, and a source of the sixth transistor being electrically connected to the constant low potential; a seventh transistor, a gate of the seventh transistor being electrically connected to the third node, a drain of the seventh transistor being electrically connected to the constant high potential, and a source of the seventh transistor being electrically connected to the second node; and an eighth transistor, a gate of the eighth transistor being electrically connected to the input terminal of the inverter, a drain of the eighth transistor being electrically connected to the second node, and a source of the eighth transistor being electrically connected to the constant low potential.

In an embodiment, the first inverter and the second inverter are configured for receiving circuit control signals by the constant low potential and the first negative potential.

In an embodiment, the first inverter and the second inverter are the same and each include: a twenty-first transistor, a gate and a drain of the twenty-first transistor being electrically connected to the constant high potential, and a source of the twenty-first transistor being electrically connected to a first node; a twenty-second transistor, a gate of the twenty-second transistor being electrically connected to an input terminal of the inverter, a drain of the twenty-second transistor being electrically connected to the first node, and a source of the twenty-second transistor being electrically connected to a first negative potential; a twenty-third transistor, a gate of the twenty-third transistor being electrically connected to the first node, a drain of the twenty-third transistor being electrically connected to the constant high potential, and a source of the twenty-third transistor being electrically connected to an output terminal of the inverter; a twenty-fourth transistor, a gate of the twenty-fourth transistor being electrically connected to the input terminal of the inverter, a drain of the twenty-fourth transistor being electrically connected to the output terminal of the inverter, and a source of the twenty-fourth transistor being electrically connected to a second node; a twenty-fifth transistor, a gate of the twenty-fifth transistor being electrically connected to a third node, a drain of the twenty-fifth transistor being electrically connected to the constant high potential, and a source of the twenty-fifth transistor being electrically connected to the second node; and a twenty-sixth transistor, a gate of the twenty-sixth transistor being electrically connected to the input terminal of the inverter, a drain of the twenty-sixth transistor being electrically connected to the second node, and a source of the twenty-sixth transistor being electrically connected to the constant low potential.

In an embodiment, the first inverter and the second inverter are configured for receiving circuit control signals by the constant high potential and the constant low potential.

In an embodiment, the first inverter includes: a first transistor, a gate and a drain of the first transistor being electrically connected to the constant high potential, and a source of the first transistor being electrically connected to a first node in the first inverter; a second transistor, a gate of the second transistor being electrically connected to an input terminal of the first inverter, a drain of the second transistor being electrically connected to the first node in the first inverter, and a source of the second transistor being electrically connected to a first negative potential; a third transistor, a gate of the third transistor being electrically connected to the first node in the first inverter, a drain of the third transistor being electrically connected to the constant high potential, and a source of the third transistor being electrically connected to an output terminal of the first inverter; a fourth transistor, a gate of the fourth transistor being electrically connected to the input terminal of the first inverter, a drain of the fourth transistor being electrically connected to the output terminal of the first inverter, and a source of the fourth transistor being electrically connected to a second node in the first inverter; a fifth transistor, a gate and a drain of the fifth transistor being electrically connected to the constant high potential, and a source of the fifth transistor being electrically connected to a third node in the first inverter; a sixth transistor, a gate of the sixth transistor being electrically connected to the input terminal of the first inverter, a drain of the sixth transistor being electrically connected to the third node in the first inverter, and a source of the sixth transistor being electrically connected to the constant low potential; a seventh transistor, a gate of the seventh transistor being electrically connected to the third node in the first inverter, a drain of the seventh transistor being electrically connected to the constant high potential, and a source of the seventh transistor being electrically connected to the second node in the first inverter; and an eighth transistor, a gate of the eighth transistor being electrically connected to the input terminal of the first inverter, a drain of the eighth transistor being electrically connected to the second node in the first inverter, and a source of the eighth transistor being electrically connected to the constant low potential. The second inverter includes: a twenty-first transistor, a gate and a drain of the twenty-first transistor being electrically connected to the constant high potential, and a source of the twenty-first transistor being electrically connected to a first node in the second inverter; a twenty-second transistor, a gate of the twenty-second transistor being electrically connected to an input terminal of the second inverter, a drain of the twenty-second transistor being electrically connected to the first node in the second inverter, and a source of the twenty-second transistor being electrically connected to the first negative potential; a twenty-third transistor, a gate of the twenty-third transistor being electrically connected to the first node in the second inverter, a drain of the twenty-third transistor being electrically connected to the constant high potential, and a source of the twenty-third transistor being electrically connected to an output terminal of the second inverter; a twenty-fourth transistor, a gate of the twenty-fourth transistor being electrically connected to the input terminal of the second inverter, a drain of the twenty-fourth transistor being electrically connected to the output terminal of the second inverter, and a source of the twenty-fourth transistor being electrically connected to a second node in the second inverter; a twenty-fifth transistor, a gate of the twenty-fifth transistor being electrically connected to a third node in the second inverter, a drain of the twenty-fifth transistor being electrically connected to the constant high potential, and a source of the twenty-fifth transistor being electrically connected to the second node in the second inverter; and a twenty-sixth transistor, a gate of the twenty-sixth transistor being electrically connected to the input terminal of the second inverter, a drain of the twenty-sixth transistor being electrically connected to the second node in the second inverter, and a source of the twenty-sixth transistor being electrically connected to the constant low potential.

In an embodiment, the first inverter is configured for receiving a circuit control signal by the constant low potential and the first negative potential, the second inverter is configured for receiving a circuit control signal by the constant high potential and the constant low potential.

In an embodiment, a relationship among the first negative potential, a second negative potential and the constant low potential is that: the constant low potential<the second negative potential<the first negative potential.

In an embodiment, the NAND logic operation circuit is configured for receiving circuit control signals by the constant high potential and the constant low potential.

In order to solve the technical problem, still another technical solution proposed by the invention is to provide a scan driving circuit for an oxide semiconductor thin film transistor. The scan driving circuit includes a NAND logic operation circuit, and the NAND logic operation circuit includes: a first inverter and a second inverter applied to a pull-down holding circuit of a GOA circuit; and a ninth transistor, a gate of the ninth transistor being electrically connected to an output terminal of the first inverter, a drain of the ninth transistor being electrically connected to a constant high potential, and a source of the ninth transistor being electrically connected to an output terminal of the logic operation circuit; a tenth transistor, a gate of the tenth transistor being electrically connected to an output terminal of the second inverter, a drain of the tenth transistor being electrically connected to the constant high potential, and a source of the tenth transistor being electrically connected to the output terminal of the logic operation circuit; an eleventh transistor, a gate of the eleventh transistor being electrically connected to a first input terminal of the logic operation circuit, and a drain of the eleventh transistor being electrically connected to the output terminal of the logic operation circuit; a twelfth transistor, a gate of the twelfth transistor being electrically connected to a second input terminal of the logic operation circuit, a drain of the twelfth transistor being electrically connected to a source of the eleventh transistor, and a source of the twelfth transistor being electrically connected to a constant low potential.

In an embodiment, the first inverter and the second inverter are the same and each include: a first transistor, a gate and a drain of the first transistor being electrically connected to the constant high potential, and a source of the first transistor being electrically connected to a first node; a second transistor, a gate of the second transistor being electrically connected to an input terminal of the inverter, a drain of the second transistor being electrically connected to the first node, and a source of the second transistor being electrically connected to a first negative potential; a third transistor, a gate of the third transistor being electrically connected to the first node, a drain of the third transistor being electrically connected to the constant high potential, and a source of the third transistor being electrically connected to an output terminal of the inverter; a fourth transistor, a gate of the fourth transistor being electrically connected to the input terminal of the inverter, a drain of the fourth transistor being electrically connected to the output terminal of the inverter, and a source of the fourth transistor being electrically connected to a second node; a fifth transistor, a gate and a drain of the fifth transistor being electrically connected to the constant high potential, and a source of the fifth transistor being electrically connected to a third node; a sixth transistor, a gate of the sixth transistor being electrically connected to the input terminal of the inverter, a drain of the sixth transistor being electrically connected to the third node, and a source of the sixth transistor being electrically connected to the constant low potential; a seventh transistor, a gate of the seventh transistor being electrically connected to the third node, a drain of the seventh transistor being electrically connected to the constant high potential, and a source of the seventh transistor being electrically connected to the second node; and an eighth transistor, a gate of the eighth transistor being electrically connected to the input terminal of the inverter, a drain of the eighth transistor being electrically connected to the second node, and a source of the eighth transistor being electrically connected to the constant low potential.

In an embodiment, the first inverter and the second inverter are configured for receiving circuit control signals by the constant low potential and the first negative potential.

In an embodiment, the first inverter and the second inverter are the same and each include: a twenty-first transistor, a gate and a drain of the twenty-first transistor being electrically connected to the constant high potential, and a source of the twenty-first transistor being electrically connected to a first node; a twenty-second transistor, a gate of the twenty-second transistor being electrically connected to an input terminal of the inverter, a drain of the twenty-second transistor being electrically connected to the first node, and a source of the twenty-second transistor being electrically connected to a first negative potential; a twenty-third transistor, a gate of the twenty-third transistor being electrically connected to the first node, a drain of the twenty-third transistor being electrically connected to the constant high potential, and a source of the twenty-third transistor being electrically connected to an output terminal of the inverter; a twenty-fourth transistor, a gate of the twenty-fourth transistor being electrically connected to the input terminal of the inverter, a drain of the twenty-fourth transistor being electrically connected to the output terminal of the inverter, and a source of the twenty-fourth transistor being electrically connected to a second node; a twenty-fifth transistor, a gate of the twenty-fifth transistor being electrically connected to a third node, a drain of the twenty-fifth transistor being electrically connected to the constant high potential, and a source of the twenty-fifth transistor being electrically connected to the second node; and a twenty-sixth transistor, a gate of the twenty-sixth transistor being electrically connected to the input terminal of the inverter, a drain of the twenty-sixth transistor being electrically connected to the second node, and a source of the twenty-sixth transistor being electrically connected to the constant low potential.

In an embodiment, the first inverter and the second inverter are configured for receiving circuit control signals by the constant high potential and the constant low potential.

In an embodiment, the first inverter includes: a first transistor, a gate and a drain of the first transistor being electrically connected to the constant high potential, and a source of the first transistor being electrically connected to a first node in the first inverter; a second transistor, a gate of the second transistor being electrically connected to an input terminal of the first inverter, a drain of the second transistor being electrically connected to the first node in the first inverter, and a source of the second transistor being electrically connected to a first negative potential; a third transistor, a gate of the third transistor being electrically connected to the first node in the first inverter, a drain of the third transistor being electrically connected to the constant high potential, and a source of the third transistor being electrically connected to an output terminal of the first inverter; a fourth transistor, a gate of the fourth transistor being electrically connected to the input terminal of the first inverter, a drain of the fourth transistor being electrically connected to the output terminal of the first inverter, and a source of the fourth transistor being electrically connected to a second node in the first inverter; a fifth transistor, a gate and a drain of the fifth transistor being electrically connected to the constant high potential, and a source of the fifth transistor being electrically connected to a third node in the first inverter; a sixth transistor, a gate of the sixth transistor being electrically connected to the input terminal of the first inverter, a drain of the sixth transistor being electrically connected to the third node in the first inverter, and a source of the sixth transistor being electrically connected to the constant low potential; a seventh transistor, a gate of the seventh transistor being electrically connected to the third node in the first inverter, a drain of the seventh transistor being electrically connected to the constant high potential, and a source of the seventh transistor being electrically connected to the second node in the first inverter; and an eighth transistor, a gate of the eighth transistor being electrically connected to the input terminal of the first inverter, a drain of the eighth transistor being electrically connected to the second node in the first inverter, and a source of the eighth transistor being electrically connected to the constant low potential. The second inverter includes: a twenty-first transistor, a gate and a drain of the twenty-first transistor being electrically connected to the constant high potential, and a source of the twenty-first transistor being electrically connected to a first node in the second inverter; a twenty-second transistor, a gate of the twenty-second transistor being electrically connected to an input terminal of the second inverter, a drain of the twenty-second transistor being electrically connected to the first node in the second inverter, and a source of the twenty-second transistor being electrically connected to the first negative potential; a twenty-third transistor, a gate of the twenty-third transistor being electrically connected to the first node in the second inverter, a drain of the twenty-third transistor being electrically connected to the constant high potential, and a source of the twenty-third transistor being electrically connected to an output terminal of the second inverter; a twenty-fourth transistor, a gate of the twenty-fourth transistor being electrically connected to the input terminal of the second inverter, a drain of the twenty-fourth transistor being electrically connected to the output terminal of the second inverter, and a source of the twenty-fourth transistor being electrically connected to a second node in the second inverter; a twenty-fifth transistor, a gate of the twenty-fifth transistor being electrically connected to a third node in the second inverter, a drain of the twenty-fifth transistor being electrically connected to the constant high potential, and a source of the twenty-fifth transistor being electrically connected to the second node in the second inverter; and a twenty-sixth transistor, a gate of the twenty-sixth transistor being electrically connected to the input terminal of the second inverter, a drain of the twenty-sixth transistor being electrically connected to the second node in the second inverter, and a source of the twenty-sixth transistor being electrically connected to the constant low potential.

In an embodiment, the first inverter is configured for receiving a circuit control signal by the constant low potential and the first negative potential, the second inverter is configured for receiving a circuit control signal by the constant high potential and the constant low potential.

In an embodiment, a relationship among the first negative potential, a second negative potential and the constant low potential is that: the constant low potential<the second negative potential<the first negative potential.

In an embodiment, the NAND logic operation circuit is configured for receiving circuit control signals by the constant high potential and the constant low potential.

The efficacy can be achieved by the invention is that: the invention provides a scan driving circuit for an oxide semiconductor thin film transistor and a NAND logic operation circuit thereof including a first inverter and a second inverter applied to a pull-down holding circuit of a GOA circuit and multiple (i.e., more than one) transistors, uses the combination of NTFT and inverter to replace the function of original PMMOS elements to achieve characteristics similar to original CMOS NAND operation circuit, and therefore solves the design problem of IGZO TFT single type of device logic operation circuit and thus is more suitable for integrating the large scale digital integrated circuit onto a liquid crystal display device.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

Figure 1:
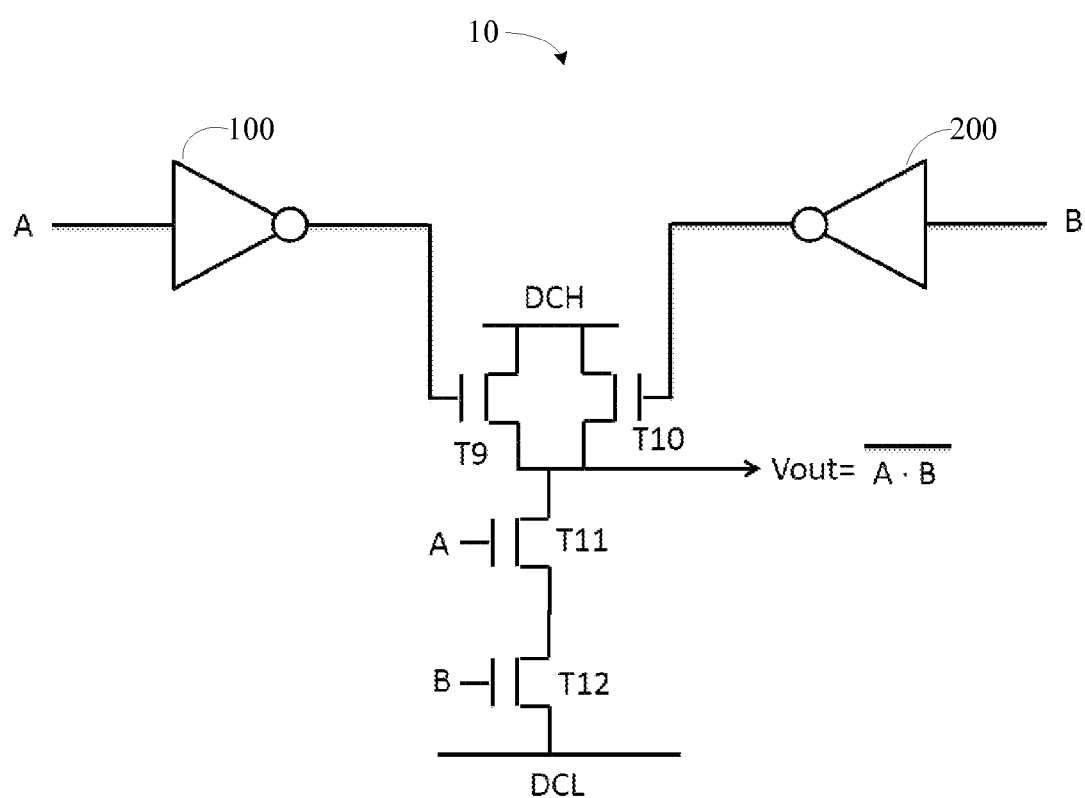
FIG. 1 is a circuit diagram of a NAND logic operation circuit of an embodiment of the invention.

Referring to FIG. 1, a circuit diagram of a NAND logic operation circuit of an embodiment of the invention is shown. The NAND logic operation circuit 10 is a logic operation circuit applied to a scan driving circuit for an oxide semiconductor thin film transistor.

In particular, the circuit 10 includes a first inverter 100 and a second inverter 200. The first inverter 100 and the second inverter 200 both are inverters applied to a pull-down holding circuit of a GOA (gate driver on array) circuit.

Furthermore, the first inverter 100 and the second inverter 200 both are main inverter parts applied to a pull-down holding circuit of a GOA circuit.

The circuit 10 further includes:

a ninth transistor T9, a gate of the ninth transistor T9 being electrically connected to an output terminal of the first inverter 100, a drain of the ninth transistor T9 being electrically connected to a constant high potential DCH, and a source of the ninth transistor T9 being electrically connected to an output terminal Vout of the logic operation circuit 10;

a tenth transistor T10, a gate of the tenth transistor T10 being electrically connected to an output terminal of the second inverter 200, a drain of the tenth transistor T10 being electrically connected to the constant high potential DCH, and a source of the tenth transistor T10 being electrically connected to the output terminal Vout of the logic operation circuit 10;

an eleventh transistor T11, a gate of the eleventh transistor T11 being electrically connected to a first input terminal A of the logic operation circuit 10, and a drain of the eleventh transistor T11 being electrically connected to the output terminal Vout of the logic operation circuit; and a twelfth transistor T12, a gate of the twelfth transistor T12 being electrically connected to a second input terminal B of the logic operation circuit 10, a drain of the twelfth transistor T12 being electrically connected to a source of the eleventh transistor T11, and a source of the twelfth transistor T12 being electrically connected to a constant low potential DCL.

In addition, the NAND logic operation circuit receives circuit control signals by the constant high potential DCH and the constant low potential DCL.

Figure 2:
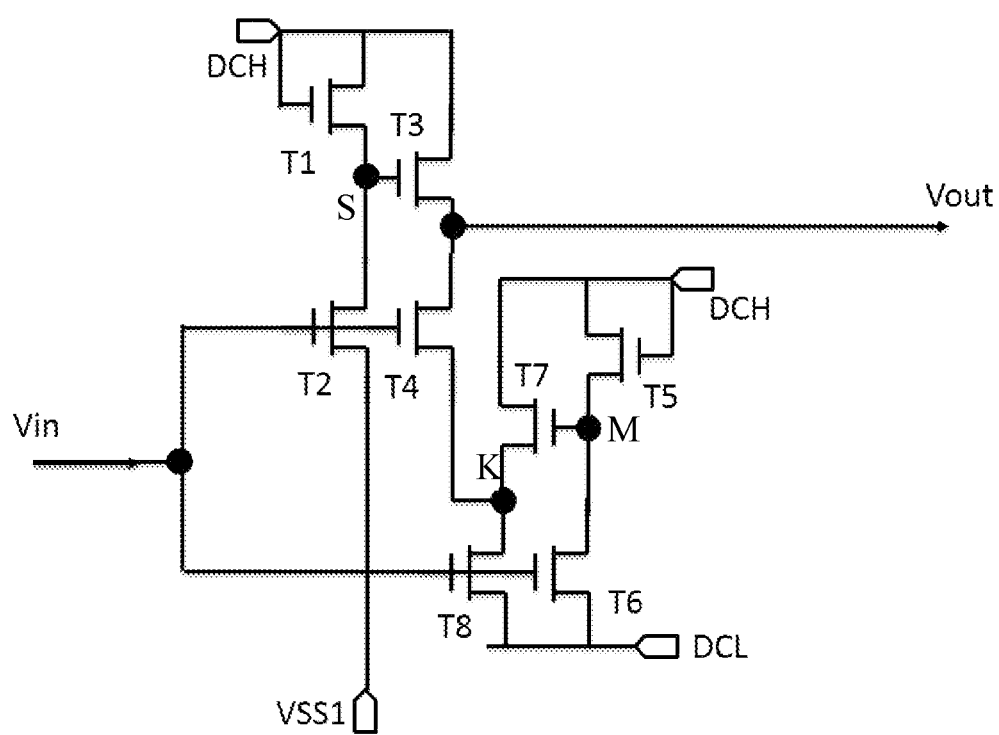
FIG. 2 is a circuit diagram of an inverter in a NAND logic operation circuit of an embodiment of the invention.

Please also refer to FIG. 2, a circuit diagram of an inverter in a NAND logic operation circuit of an embodiment of the invention is shown. The constitution and connection relationship of the inverter are as follows:

a first transistor T1, a gate and a drain of the first transistor T1 being electrically connected to the constant high potential DCH, and a source of the first transistor T1 being electrically connected to a first node S;

a second transistor T2, a gate of the second transistor T2 being electrically connected to an input terminal Vin of the inverter, a drain of the second transistor T2 being electrically connected to the first node S, and a source of the second transistor T2 being electrically connected to a first negative potential VSS1;

a third transistor T3, a gate of the third transistor T3 being electrically connected to the first node S, a drain of the third transistor T3 being electrically connected to the constant high potential DCH, and a source of the third transistor T3 being electrically connected to an output terminal Vout of the inverter;

a fourth transistor T4, a gate of the fourth transistor T4 being electrically connected to the input terminal Vin of the inverter, a drain of the fourth transistor T4 being electrically connected to the output terminal Vout of the inverter, and a source of the fourth transistor T4 being electrically connected to a second node K;

a fifth transistor T5, a gate and a drain of the fifth transistor T5 being electrically connected to the constant high potential DCH, and a source of the fifth transistor T5 being electrically connected to a third node M;

a sixth transistor T6, a gate of the sixth transistor T6 being electrically connected to the input terminal Vin of the inverter, a drain of the sixth transistor T6 being electrically connected to the third node M, and a source of the sixth transistor T6 being electrically connected to the constant low potential DCL;

a seventh transistor T7, a gate of the seventh transistor T7 being electrically connected to the third node M, a drain of the seventh transistor T7 being electrically connected to the constant high potential DCH, and a source of the seventh transistor T7 being electrically connected to the second node K; and an eighth transistor T8, a gate of the eighth transistor T8 being electrically connected to the input terminal Vin of the inverter, a drain of the eighth transistor T8 being electrically connected to the second node K, and a source of the eighth transistor T8 being electrically connected to the constant low potential DCL.

In addition, the inverter as shown in FIG. 2 receives a circuit control signal by the constant low potential DCL and the first negative potential VSS1.

A relationship between the first negative potential VSS1 and the constant low potential DCL is that: the constant low potential DCL<the first negative potential VSS1, i.e., the constant low potential DCL is lower than the first negative potential VSS1.

Figure 3:
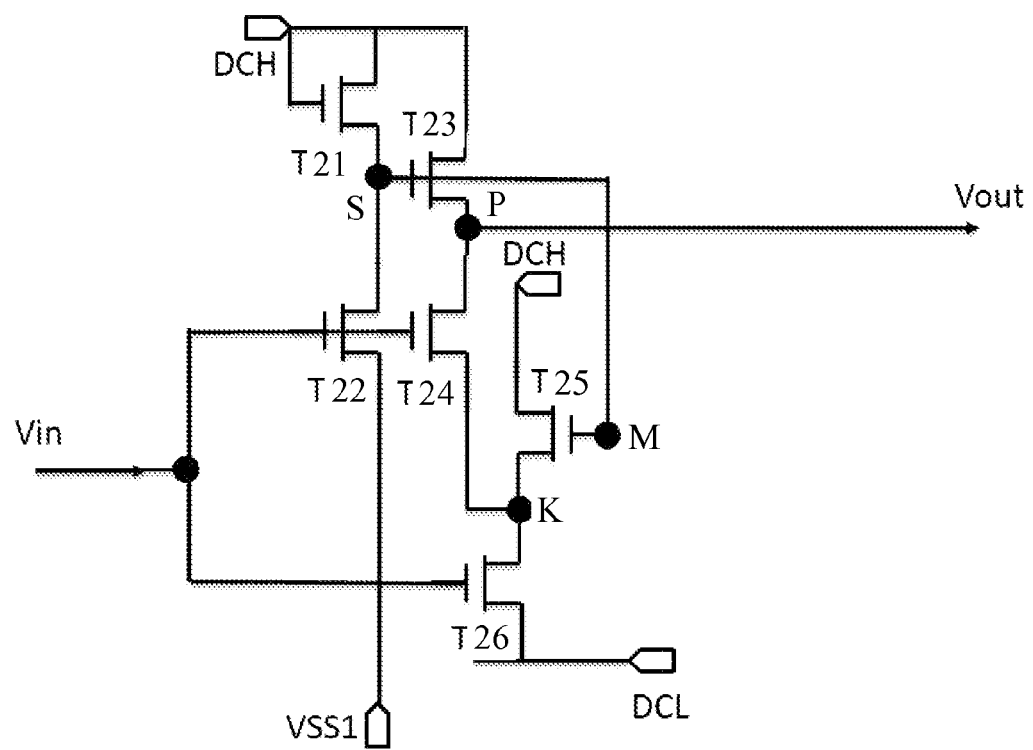
FIG. 3 is a circuit diagram of an inverter in a NAND logic operation circuit of another embodiment of the invention.

Please refer to FIG. 3, a circuit diagram of an inverter in a NAND logic operation circuit in another embodiment of the invention is shown. The constitution and connection relationship of the inverter are as follows:

a twenty-first transistor T21, a gate and a drain of the twenty-first transistor T21 being electrically connected to the constant high potential DCH, and a source of the twenty-first transistor T21 being electrically connected to a first node S;

a twenty-second transistor T22, a gate of the twenty-second transistor T22 being electrically connected to an input terminal Vin of the inverter, a drain of the twenty-second transistor T22 being electrically connected to the first node S, and a source of the twenty-second transistor T22 being electrically connected to a first negative potential VSS1;

a twenty-third transistor T23, a gate of the twenty-third transistor T23 being electrically connected to the first node S, a drain of the twenty-third transistor T23 being electrically connected to the constant high potential DCH, and a source of the twenty-third transistor T23 being electrically connected to an output terminal Vout of the inverter;

a twenty-fourth transistor T24, a gate of the twenty-fourth transistor T24 being electrically connected to the input terminal Vin of the inverter, a drain of the twenty-fourth transistor T24 being electrically connected to the output terminal Vout of the inverter, and a source of the twenty-fourth transistor T24 being electrically connected to a second node K;

a twenty-fifth transistor T25, a gate of the twenty-fifth transistor T25 being electrically connected to a third node M (also is the first node S as shown in FIG. 3), a drain of the twenty-fifth transistor T25 being electrically connected to the constant high potential DCH, and a source of the twenty-fifth transistor T25 being electrically connected to the second node K; and a twenty-sixth transistor T26, a gate of the twenty-sixth transistor T26 being electrically connected to the input terminal Vin of the inverter, a drain of the twenty-sixth transistor T26 being electrically connected to the second node K, and a source of the twenty-sixth transistor T26 being electrically connected to the constant low potential DCL.

In addition, the inverter as shown in FIG. 3 receives a circuit control signal by the constant high potential DCH and the constant low potential DCL.

A relationship between the first negative potential VSS1 and the constant low potential DCL is that: the constant low potential DCL<the first negative potential VSS1.

In an embodiment, the first inverter and the second inverter in the circuit 10 both adopt the inverter as shown FIG. 2.

In another embodiment, the first inverter and the second inverter in the circuit 10 both adopts the inverter as shown in FIG. 3.

In still another embodiment, the first inverter in the circuit 10 adopts the inverter as shown in FIG. 2, and the second inverter in the circuit 10 adopts the inverter as shown in FIG. 3.

In addition, in the above embodiments, all the transistors may be IGZO (indium gallium zinc oxide) NTFTs.

In summary, the invention provides a scan driving circuit for an oxide semiconductor thin film transistor and a NAND logic operation circuit thereof including a first inverter and a second inverter applied to a pull-down holding circuit of a GOA circuit and multiple (i.e., more than one) transistors, uses the combination of NTFT and inverter to replace the function of original PMMOS elements to achieve characteristics similar to original CMOS NAND operation circuit, and therefore solves the design problem of IGZO TFT single type of device logic operation circuit and thus is more suitable for integrating a large scale digital integrated circuit onto a liquid crystal display device.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A NAND logic operation circuit comprising:
 a first inverter and a second inverter, applied to a pull-down holding circuit of a gate driver on array (GOA) circuit; and a ninth transistor (T9), a gate of the ninth transistor being electrically connected to an output terminal of the first inverter, a drain of the ninth transistor being electrically connected to a constant high potential (DCH), and a source of the ninth transistor being electrically connected to an output terminal (Vout) of the logic operation circuit;

a tenth transistor (T10), a gate of the tenth transistor being electrically connected to an output terminal of the second inverter, a drain of the tenth transistor being electrically connected to the constant high potential (DCH), and a source of the tenth transistor being electrically connected to the output terminal (Vout) of the logic operation circuit;

an eleventh transistor (T11), a gate of the eleventh transistor being electrically connected to a first input terminal (A) of the logic operation circuit, and a drain of the eleventh transistor being electrically connected to the output terminal (Vout) of the logic operation circuit; and a twelfth transistor (T12), a gate of the twelfth transistor being electrically connected to a second input terminal (B) of the logic operation circuit, a drain of the twelfth transistor being electrically connected to a source of the eleventh transistor (T11), and a source of the twelfth transistor being electrically connected to a constant low potential (DCL);

wherein the first inverter and the second inverter are configured for receiving circuit control signals by the constant low potential (DCL) and a first negative potential (VSS1).

2. A NAND logic operation circuit comprising:

a first inverter and a second inverter, applied to a pull-down holding circuit of a gate driver on array (GOA) circuit; and a ninth transistor (T9), a gate of the ninth transistor being electrically connected to an output terminal of the first inverter, a drain of the ninth transistor being electrically connected to a constant high potential (DCH), and a source of the ninth transistor being electrically connected to an output terminal (Vout) of the logic operation circuit;

a tenth transistor (T10), a gate of the tenth transistor being electrically connected to an output terminal of the second inverter, a drain of the tenth transistor being electrically connected to the constant high potential (DCH), and a source of the tenth transistor being electrically connected to the output terminal (Vout) of the logic operation circuit;

an eleventh transistor (T11), a gate of the eleventh transistor being electrically connected to a first input terminal (A) of the logic operation circuit, and a drain of the eleventh transistor being electrically connected to the output terminal (Vout) of the logic operation circuit; and a twelfth transistor (T12), a gate of the twelfth transistor being electrically connected to a second input terminal (B) of the logic operation circuit, a drain of the twelfth transistor being electrically connected to a source of the eleventh transistor (T11), and a source of the twelfth transistor being electrically connected to a constant low potential (DCL).

3. The NAND logic operation circuit as claimed in claim 2, wherein the first inverter and the second inverter are the same and each comprise:

a first transistor (T1), a gate and a drain of the first transistor being electrically connected to the constant high potential (DCH), and a source of the first transistor being electrically connected to a first node (S);

a second transistor (T2), a gate of the second transistor being electrically connected to an input terminal (Vin) of the inverter, a drain of the second transistor being electrically connected to the first node (S), and a source of the second transistor being electrically connected to a first negative potential (VSS1);

a third transistor (T3), a gate of the third transistor being electrically connected to the first node (S), a drain of the third transistor being electrically connected to the constant high potential (DCH), and a source of the third transistor being electrically connected to an output terminal (Vout) of the inverter;

a fourth transistor (T4), a gate of the fourth transistor being electrically connected to the input terminal (Vin) of the inverter, a drain of the fourth transistor being electrically connected to the output terminal (Vout) of the inverter, and a source of the fourth transistor being electrically connected to a second node (K);

a fifth transistor (T5), a gate and a drain of the fifth transistor being electrically connected to the constant high potential (DCH), and a source of the fifth transistor being electrically connected to a third node (M);

a sixth transistor (T6), a gate of the sixth transistor being electrically connected to the input terminal (Vin) of the inverter, a drain of the sixth transistor being electrically connected to the third node (M), and a source of the sixth transistor being electrically connected to the constant low potential (DCL);

a seventh transistor (T7), a gate of the seventh transistor being electrically connected to the third node (M), a drain of the seventh transistor being electrically connected to the constant high potential (DCH), and a source of the seventh transistor being electrically connected to the second node (K); and an eighth transistor (T8), a gate of the eighth transistor being electrically connected to the input terminal (Vin) of the inverter, a drain of the eighth transistor being electrically connected to the second node (K), and a source of the eighth transistor being electrically connected to the constant low potential (DCL).

4. The NAND logic operation circuit as claimed in claim 3, wherein the first inverter and the second inverter are configured for receiving circuit control signals by the constant low potential (DCL) and the first negative potential (VSS1).

5. The NAND logic operation circuit as claimed in claim 2, wherein the first inverter and the second inverter are the same and each comprise:

a twenty-first transistor (T21), a gate and a drain of the twenty-first transistor being electrically connected to the constant high potential (DCH), and a source of the twenty-first transistor being electrically connected to a first node (S);

a twenty-second transistor (T22), a gate of the twenty-second transistor being electrically connected to an input terminal of the inverter, a drain of the twenty-second transistor being electrically connected to the first node (S), and a source of the twenty-second transistor being electrically connected to a first negative potential (VSS1);

a twenty-third transistor (T23), a gate of the twenty-third transistor being electrically connected to the first node (S), a drain of the twenty-third transistor being electrically connected to the constant high potential (DCH), and a source of the twenty-third transistor being electrically connected to an output terminal (Vout) of the inverter;

a twenty-fourth transistor (T24), a gate of the twenty-fourth transistor being electrically connected to the input terminal (Vin) of the inverter, a drain of the twenty-fourth transistor being electrically connected to the output terminal (Vout) of the inverter, and a source of the twenty-fourth transistor being electrically connected to a second node (K);

a twenty-fifth transistor (T25), a gate of the twenty-fifth transistor being electrically connected to a third node (M), a drain of the twenty-fifth transistor being electrically connected to the constant high potential (DCH), and a source of the twenty-fifth transistor being electrically connected to the second node (K); and a twenty-sixth transistor (T26), a gate of the twenty-sixth transistor being electrically connected to the input terminal (Vin) of the inverter, a drain of the twenty-sixth transistor being electrically connected to the second node (K), and a source of the twenty-sixth transistor being electrically connected to the constant low potential (DCL).

6. The NAND logic operation circuit as claimed in claim 5, wherein the first inverter and the second inverter are configured for receiving circuit control signals by the constant high potential (DCH) and the constant low potential (DCL).

7. The NAND logic operation circuit as claimed in claim 2, wherein the first inverter comprises:

a first transistor (T1), a gate and a drain of the first transistor being electrically connected to the constant high potential (DCH), and a source of the first transistor being electrically connected to a first node (S) in the first inverter;

a second transistor (T2), a gate of the second transistor being electrically connected to an input terminal (Vin) of the first inverter, a drain of the second transistor being electrically connected to the first node (S) in the first inverter, and a source of the second transistor being electrically connected to a first negative potential (VSS1);

a third transistor (T3), a gate of the third transistor being electrically connected to the first node (S) in the first inverter, a drain of the third transistor being electrically connected to the constant high potential (DCH), and a source of the third transistor being electrically connected to an output terminal (Vout) of the first inverter;

a fourth transistor (T4), a gate of the fourth transistor being electrically connected to the input terminal (Vin) of the first inverter, a drain of the fourth transistor being electrically connected to the output terminal (Vout) of the first inverter, and a source of the fourth transistor being electrically connected to a second node (K) in the first inverter;

a fifth transistor (T5), a gate and a drain of the fifth transistor being electrically connected to the constant high potential (DCH), and a source of the fifth transistor being electrically connected to a third node (M) in the first inverter;

a sixth transistor (T6), a gate of the sixth transistor being electrically connected to the input terminal (Vin) of the first inverter, a drain of the sixth transistor being electrically connected to the third node (M) in the first inverter, and a source of the sixth transistor being electrically connected to the constant low potential (DCL);

a seventh transistor (T7), a gate of the seventh transistor being electrically connected to the third node (M) in the first inverter, a drain of the seventh transistor being electrically connected to the constant high potential (DCH), and a source of the seventh transistor being electrically connected to the second node (K) in the first inverter; and an eighth transistor (T8), a gate of the eighth transistor being electrically connected to the input terminal (Vin) of the first inverter, a drain of the eighth transistor being electrically connected to the second node (K) in the first inverter, and a source of the eighth transistor being electrically connected to the constant low potential (DCL);

the second inverter comprises:

a twenty-first transistor (T21), a gate and a drain of the twenty-first transistor being electrically connected to the constant high potential (DCH), and a source of the twenty-first transistor being electrically connected to a first node (S) in the second inverter;

a twenty-second transistor (T22), a gate of the twenty-second transistor being electrically connected to an input terminal of the second inverter, a drain of the twenty-second transistor being electrically connected to the first node (S) in the second inverter, and a source of the twenty-second transistor being electrically connected to the first negative potential (VSS1);

a twenty-third transistor (T23), a gate of the twenty-third transistor being electrically connected to the first node (S) in the second inverter, a drain of the twenty-third transistor being electrically connected to the constant high potential (DCH), and a source of the twenty-third transistor being electrically connected to an output terminal (Vout) of the second inverter;

a twenty-fourth transistor (T24), a gate of the twenty-fourth transistor being electrically connected to the input terminal (Vin) of the second inverter, a drain of the twenty-fourth transistor being electrically connected to the output terminal (Vout) of the second inverter, and a source of the twenty-fourth transistor being electrically connected to a second node (K) in the second inverter;

a twenty-fifth transistor (T25), a gate of the twenty-fifth transistor being electrically connected to a third node (M) in the second inverter, a drain of the twenty-fifth transistor being electrically connected to the constant high potential (DCH), and a source of the twenty-fifth transistor being electrically connected to the second node (K) in the second inverter; and a twenty-sixth transistor (T26), a gate of the twenty-sixth transistor being electrically connected to the input terminal (Vin) of the second inverter, a drain of the twenty-sixth transistor being electrically connected to the second node (K) in the second inverter, and a source of the twenty-sixth transistor being electrically connected to the constant low potential (DCL).

8. The NAND logic operation circuit as claimed in claim 7, wherein the first inverter is configured for receiving a circuit control signal by the constant low potential (DCL) and the first negative potential (VSS1), the second inverter is configured for receiving a circuit control signal by the constant high potential (DCH) and the constant low potential (DCL).

9. The NAND logic operation circuit as claimed in claim 8, wherein a relationship among the first negative potential (VSS1), a second negative potential (VSS2) and the constant low potential (DCL) is that: the constant low potential (DCL)<the second negative potential (VSS2)<the first negative potential (VSS1).

10. The NAND logic operation circuit as claimed in claim 2, wherein the NAND logic operation circuit is configured for receiving circuit control signals by the constant high potential (DCH) and the constant low potential (DCL).

11. A scan driving circuit for an oxide semiconductor thin film transistor, and the scan driving circuit comprising a NAND logic operation circuit; wherein the NAND logic operation circuit comprises:
   a first inverter and a second inverter, applied to a pull-down holding circuit of a gate driver on array (GOA) circuit; and
   a ninth transistor (T9), a gate of the ninth transistor being electrically connected to an output terminal of the first inverter, a drain of the ninth transistor being electrically connected to a constant high potential (DCH), and a source of the ninth transistor being electrically connected to an output terminal (Vout) of the logic operation circuit;
   a tenth transistor (T10), a gate of the tenth transistor being electrically connected to an output terminal of the second inverter, a drain of the tenth transistor being electrically connected to the constant high potential (DCH), and a source of the tenth transistor being electrically connected to the output terminal (Vout) of the logic operation circuit;
   an eleventh transistor (T11), a gate of the eleventh transistor being electrically connected to a first input terminal (A) of the logic operation circuit, and a drain of the eleventh transistor being electrically connected to the output terminal (Vout) of the logic operation circuit; and
   a twelfth transistor (T12), a gate of the twelfth transistor being electrically connected to a second input terminal (B) of the logic operation circuit, a drain of the twelfth transistor being electrically connected to a source of the eleventh transistor (T11), and a source of the twelfth transistor being electrically connected to a constant low potential (DCL).

12. The scan driving circuit for an oxide semiconductor thin film transistor as claimed in claim 11, wherein the first inverter and the second inverter are the same and each comprise:
   a first transistor (T1), a gate and a drain of the first transistor being electrically connected to the constant high potential (DCH), and a source of the first transistor being electrically connected to a first node (S);
   a second transistor (T2), a gate of the second transistor being electrically connected to an input terminal (Vin) of the inverter, a drain of the second transistor being electrically connected to the first node (S), and a source of the second transistor being electrically connected to a first negative potential (VSS1);
   a third transistor (T3), a gate of the third transistor being electrically connected to the first node (S), a drain of the third transistor being electrically connected to the constant high potential (DCH), and a source of the third transistor being electrically connected to an output terminal (Vout) of the inverter;
   a fourth transistor (T4), a gate of the fourth transistor being electrically connected to the input terminal (Vin) of the inverter, a drain of the fourth transistor being electrically connected to the output terminal (Vout) of the inverter, and a source of the fourth transistor being electrically connected to a second node (K);
   a fifth transistor (T5), a gate and a drain of the fifth transistor being electrically connected to the constant high potential (DCH), and a source of the fifth transistor being electrically connected to a third node (M);
   a sixth transistor (T6), a gate of the sixth transistor being electrically connected to the input terminal (Vin) of the inverter, a drain of the sixth transistor being electrically connected to the third node (M), and a source of the sixth transistor being electrically connected to the constant low potential (DCL);
   a seventh transistor (T7), a gate of the seventh transistor being electrically connected to the third node (M), a drain of the seventh transistor being electrically connected to the constant high potential (DCH), and a source of the seventh transistor being electrically connected to the second node (K); and
   an eighth transistor (T8), a gate of the eighth transistor being electrically connected to the input terminal (Vin) of the inverter, a drain of the eighth transistor being electrically connected to the second node (K), and a source of the eighth transistor being electrically connected to the constant low potential (DCL).

13. The scan driving circuit for an oxide semiconductor thin film transistor as claimed in claim 12, wherein the first inverter and the second inverter are configured for receiving circuit control signals by the constant low potential (DCL) and the first negative potential (VSS1).

14. The scan driving circuit for an oxide semiconductor thin film transistor as claimed in claim 11, wherein the first inverter and the second inverter are the same and each comprise:
   a twenty-first transistor (T21), a gate and a drain of the twenty-first transistor being electrically connected to the constant high potential (DCH), and a source of the twenty-first transistor being electrically connected to a first node (S);
   a twenty-second transistor (T22), a gate of the twenty-second transistor being electrically connected to an input terminal of the inverter, a drain of the twenty-second transistor being electrically connected to the first node (S), and a source of the twenty-second transistor being electrically connected to a first negative potential (VSS1);
   a twenty-third transistor (T23), a gate of the twenty-third transistor being electrically connected to the first node (S), a drain of the twenty-third transistor being electrically connected to the constant high potential (DCH), and a source of the twenty-third transistor being electrically connected to an output terminal (Vout) of the inverter;
   a twenty-fourth transistor (T24), a gate of the twenty-fourth transistor being electrically connected to the input terminal (Vin) of the inverter, a drain of the twenty-fourth transistor being electrically connected to the output terminal (Vout) of the inverter, and a source of the twenty-fourth transistor being electrically connected to a second node (K);
   a twenty-fifth transistor (T25), a gate of the twenty-fifth transistor being electrically connected to a third node (M), a drain of the twenty-fifth transistor being electrically connected to the constant high potential (DCH), and a source of the twenty-fifth transistor being electrically connected to the second node (K); and a twenty-sixth transistor (T26), a gate of the twenty-sixth transistor being electrically connected to the input terminal (Vin) of the inverter, a drain of the twenty-sixth transistor being electrically connected to the second node (K), and a source of the twenty-sixth transistor being electrically connected to the constant low potential (DCL).

15. The scan driving circuit for an oxide semiconductor thin film transistor as claimed in claim 14, wherein the first inverter and the second inverter are configured for receiving circuit control signals by the constant high potential (DCH) and the constant low potential (DCL).

16. The scan driving circuit for an oxide semiconductor thin film transistor as claimed in claim 11, wherein
the first inverter comprises:
a first transistor (T1), a gate and a drain of the first transistor being electrically connected to the constant high potential (DCH), and a source of the first transistor being electrically connected to a first node (S) in the first inverter;
a second transistor (T2), a gate of the second transistor being electrically connected to an input terminal (Vin) of the first inverter, a drain of the second transistor being electrically connected to the first node (S) in the first inverter, and a source of the second transistor being electrically connected to a first negative potential (VSS1);
a third transistor (T3), a gate of the third transistor being electrically connected to the first node (S) in the first inverter, a drain of the third transistor being electrically connected to the constant high potential (DCH), and a source of the third transistor being electrically connected to an output terminal (Vout) of the first inverter;
a fourth transistor (T4), a gate of the fourth transistor being electrically connected to the input terminal (Vin) of the first inverter, a drain of the fourth transistor being electrically connected to the output terminal (Vout) of the first inverter, and a source of the fourth transistor being electrically connected to a second node (K) in the first inverter;
a fifth transistor (T5), a gate and a drain of the fifth transistor being electrically connected to the constant high potential (DCH), and a source of the fifth transistor being electrically connected to a third node (M) in the first inverter;
a sixth transistor (T6), a gate of the sixth transistor being electrically connected to the input terminal (Vin) of the first inverter, a drain of the sixth transistor being electrically connected to the third node (M) in the first inverter, and a source of the sixth transistor being electrically connected to the constant low potential (DCL);
a seventh transistor (T7), a gate of the seventh transistor being electrically connected to the third node (M) in the first inverter, a drain of the seventh transistor being electrically connected to the constant high potential (DCH), and a source of the seventh transistor being electrically connected to the second node (K) in the first inverter; and
an eighth transistor (T8), a gate of the eighth transistor being electrically connected to the input terminal (Vin) of the first inverter, a drain of the eighth transistor being electrically connected to the second node (K) in the first inverter, and a source of the eighth transistor being electrically connected to the constant low potential (DCL);

the second inverter comprises:
a twenty-first transistor (T21), a gate and a drain of the twenty-first transistor being electrically connected to the constant high potential (DCH), and a source of the twenty-first transistor being electrically connected to a first node (S) in the second inverter;
a twenty-second transistor (T22), a gate of the twenty-second transistor being electrically connected to an input terminal of the second inverter, a drain of the twenty-second transistor being electrically connected to the first node (S) in the second inverter, and a source of the twenty-second transistor being electrically connected to the first negative potential (VSS1);
a twenty-third transistor (T23), a gate of the twenty-third transistor being electrically connected to the first node (S) in the second inverter, a drain of the twenty-third transistor being electrically connected to the constant high potential (DCH), and a source of the twenty-third transistor being electrically connected to an output terminal (Vout) of the second inverter;
a twenty-fourth transistor (T24), a gate of the twenty-fourth transistor being electrically connected to the input terminal (Vin) of the second inverter, a drain of the twenty-fourth transistor being electrically connected to the output terminal (Vout) of the second inverter, and a source of the twenty-fourth transistor being electrically connected to a second node (K) in the second inverter;
a twenty-fifth transistor (T25), a gate of the twenty-fifth transistor being electrically connected to a third node (M) in the second inverter, a drain of the twenty-fifth transistor being electrically connected to the constant high potential (DCH), and a source of the twenty-fifth transistor being electrically connected to the second node (K) in the second inverter; and
a twenty-sixth transistor (T26), a gate of the twenty-sixth transistor being electrically connected to the input terminal (Vin) of the second inverter, a drain of the twenty-sixth transistor being electrically connected to the second node (K) in the second inverter, and a source of the twenty-sixth transistor being electrically connected to the constant low potential (DCL).

17. The scan driving circuit for an oxide semiconductor thin film transistor as claimed in claim 16, wherein the first inverter is configured for receiving a circuit control signal by the constant low potential (DCL) and the first negative potential (VSS1), the second inverter is configured for receiving a circuit control signal by the constant high potential (DCH) and the constant low potential (DCL).

18. The scan driving circuit for an oxide semiconductor thin film transistor as claimed in claim 17, wherein a relationship among the first negative potential (VSS1), a second negative potential (VSS2) and the constant low potential (DCL) is that: the constant low potential (DCL)<the second negative potential (VSS2)<the first negative potential (VSS1).

19. The scan driving circuit for an oxide semiconductor thin film transistor as claimed in claim 11, wherein the NAND logic operation circuit is configured for receiving circuit control signals by the constant high potential (DCH) and the constant low potential (DCL).

* * * * *